(12) United States Patent
Han et al.

(10) Patent No.: US 11,599,196 B2
(45) Date of Patent: Mar. 7, 2023

(54) DISPLAY SUBSTRATE, PREPARATION METHOD THEREOF, AND DISPLAY APPARATUS

(71) Applicant: BOE Technology Group Co., Ltd., Beijing (CN)

(72) Inventors: Yanling Han, Beijing (CN); Jing Yu, Beijing (CN); Yue Gou, Beijing (CN); Peixiao Li, Beijing (CN); Yaqian Ji, Beijing (CN); Xiufeng Li, Beijing (CN); Lei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/489,968

(22) Filed: Sep. 30, 2021

(65) Prior Publication Data
US 2022/0147146 A1 May 12, 2022

(30) Foreign Application Priority Data

Nov. 10, 2020 (CN) .......................... 202011250034.8

(51) Int. Cl.
*G06F 3/01* (2006.01)
*B06B 1/02* (2006.01)
*H01L 33/58* (2010.01)
*G06F 3/043* (2006.01)
*H01L 25/075* (2006.01)

(52) U.S. Cl.
CPC ............ *G06F 3/016* (2013.01); *B06B 1/0207* (2013.01); *B06B 1/0292* (2013.01); *G06F 3/017* (2013.01); *G06F 3/043* (2013.01); *H01L 25/0753* (2013.01); *H01L 33/58* (2013.01); *B06B 2201/51* (2013.01)

(58) Field of Classification Search
CPC .......... G06F 3/016; G06F 3/017; G06F 3/043; B06B 1/0207; B06B 1/0292; B06B 2201/51; H01L 25/0753; H01L 33/58
See application file for complete search history.

(56) References Cited

U.S. PATENT DOCUMENTS

2019/0197284 A1* 6/2019 Park ...................... G06F 3/0412

* cited by examiner

*Primary Examiner* — Kenneth B Lee, Jr.
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes a substrate, an array structure layer disposed on the substrate, a plurality of emitting units and a plurality of ultrasonic transducers disposed at intervals on a side of the array structure layer away from the substrate, wherein the ultrasonic transducers are disposed between adjacent emitting units, and the array structure layer includes a transducer drive circuit connected to the ultrasonic transducer, and the transducer drive circuit is configured to control the ultrasonic transducer to transmit ultrasonic waves and receive voltage signals generated by the ultrasonic transducer receiving echoes.

15 Claims, 11 Drawing Sheets

DISPLAY SUBSTRATE, PREPARATION METHOD THEREOF, AND DISPLAY APPARATUS

CROSS-REFERENCE TO RELATED APPLICATION

The present application claims the priority of Chinese Patent Application No. 202011250034.8 filed to the CNIPA on Nov. 10, 2020, the content of which is hereby incorporated by reference.

TECHNICAL FIELD

The embodiment of the present disclosure relates to, but is not limited to, a field of display technologies, and particularly relates to a display substrate and a preparation method thereof, and a display apparatus.

BACKGROUND

With a development of science and technology, Liquid Crystal Display (LCD) and Organic Light-Emitting Diode (OLED) display apparatuses have achieved touch control. Although touch screens of smart devices bring many brand-new experiences to users, users also lose experiences of pressing the physical keyboard.

Touch Feedback technology may make people have an experience of touching real objects when touching the screen. For example, when playing Angry Bird on the touch screen, people will feel an elasticity of rubber bands by stretching a slingshot. Most of the existing haptic feedback apparatuses use projection display or place an ultrasonic apparatus on a back of a display apparatus to project downwards, which does not achieve true integration with the display.

SUMMARY

Below is a summary about the subject matter described in the present disclosure in detail. The summary is not intended to limit the scope of protection of the claims.

A display substrate provided by the embodiment of the present disclosure, including a substrate, an array structure layer disposed on the substrate, a plurality of emitting units and a plurality of ultrasonic transducers disposed at intervals on a side of the array structure layer away from the substrate, wherein the ultrasonic transducers are disposed between adjacent emitting units; and the array structure layer includes a transducer drive circuit connected to the ultrasonic transducer, and the transducer drive circuit is configured to control the ultrasonic transducers to transmit ultrasonic waves and receive voltage signals generated by the ultrasonic transducers receiving ultrasonic echoes.

In some exemplary embodiments, a plurality of emitting units include a plurality of rows of emitting units extending along a first direction and disposed at intervals along a second direction and a plurality of columns of emitting units extending along the second direction and disposed at intervals along the first direction;

the ultrasonic transducers are disposed in a region surrounded by adjacent emitting unit rows and adjacent emitting unit columns; or, the ultrasonic transducers are disposed between adjacent emitting units in at least one row of a plurality of rows of the emitting units; or the ultrasonic transducers are disposed between adjacent emitting units in at least one column of a plurality of columns of the emitting units.

In some exemplary embodiments, a plurality of ultrasonic transducers are divided into a plurality of array elements; the transducer drive circuit includes a plurality of transducer sub-drive circuits; and the array elements are correspondingly connected to the transducer sub-drive circuits.

In some exemplary embodiments, a plurality of array elements include a first array element, the ultrasonic transducers of the first array element include a plurality of first ultrasonic transducers for transmitting ultrasonic waves and a plurality of second ultrasonic transducers for receiving ultrasonic echoes, and the transducer sub-drive circuit corresponding to the first array element includes an ultrasonic transmitting circuit connected to a plurality of first ultrasonic transducers and an ultrasonic receiving circuit connected to a plurality of second ultrasonic transducers.

In some exemplary embodiments, the first ultrasonic transducers and the second ultrasonic transducers are alternately disposed in a first direction or a second direction.

In some exemplary embodiments, an ultrasonic transducer includes a first electrode and a second electrode, and the ultrasonic transmitting circuit includes a first power terminal and a second power terminal, wherein the first power terminal is connected to first electrodes of a plurality of first ultrasonic transducers, and the second power terminal is connected to second electrodes of a plurality of first ultrasonic transducers.

In some exemplary embodiments, an ultrasonic transducer includes a first electrode and a second electrode, and a plurality of second ultrasonic transducers are connected in series, wherein a second electrode of a second ultrasonic transducer located at a head end is connected to a first electrode of an adjacent second ultrasonic transducer, a first electrode of a second ultrasonic transducer at a tail end is connected to a second electrode of an adjacent second ultrasonic transducer. The ultrasonic receiving circuit includes a first receiving terminal connected to a first electrode of a second ultrasonic transducer at a head end and a second receiving terminal connected to a second electrode of a second ultrasonic transducer at a tail end.

In some exemplary embodiments, a plurality of array elements include a second array element; the transducer drive circuit includes a transmission-reception integrated circuit correspondingly connected to the second array element; the ultrasonic transducer includes a first electrode and a second electrode; the transmission-reception integrated circuit includes a first power terminal, a second power terminal, a first receiving terminal, a second receiving terminal, a first scan terminal, a second scan terminal, a plurality of first switch transistors, a plurality of second switch transistors and a plurality of third switch transistors, wherein the first switch transistors and the second switch transistors correspond to the ultrasonic transducer; a first electrode of the first switch transistor is connected to a first electrode of a corresponding ultrasonic transducer; a second electrode of the first switch transistor is connected to the first power terminal; a control electrode of the first switch transistor is connected to the first scan terminal; a first electrode of the second switch transistor is connected to a second electrode of a corresponding ultrasonic transducer; a second electrode of the second switch transistor is connected to the second power terminal; a control electrode of the second switch transistor is connected to the first scan terminal; a plurality of third switch transistors are alternately connected in series with a plurality of ultrasonic transducers;

a first electrode of the third switch transistor is connected to a second electrode of a corresponding ultrasonic transducer; a second electrode of the third switch transistor is connected to a first electrode of a corresponding ultrasonic transducer; a control electrode of the third switch transistor is connected to the second scan terminal; a first electrode of the ultrasonic transducer at a head end is connected to the first receiving terminal; and a second electrode of the ultrasonic transducer at a tail end is connected to the second receiving terminal.

In some exemplary embodiments, an emitting unit includes a Mini LED or μLED, and the ultrasonic transducer includes a capacitive micromachined ultrasonic transducer.

In some exemplary embodiments, the display substrate further includes a light shielding layer disposed on a side of the array structure layer away from the substrate;

the light shielding layer is provided with a first opening and a second opening, the emitting unit is disposed in the first opening, and the ultrasonic transducer is disposed in the second opening; or, the light shielding layer covers a region of a side of the array structure layer away from the substrate except the emitting unit and the ultrasonic transducer.

An embodiment of the present disclosure further provides a display apparatus including the display substrate of any aforementioned embodiment.

In some exemplary embodiments, the display apparatus further includes a host, a gesture capture module, a haptic feedback module and a display drive module connected to the host, wherein the display substrate includes a transducer drive circuit connected to an ultrasonic sensor and a pixel drive circuit connected to an emitting element, and a first power terminal and a second power terminal of the transducer drive circuit are connected to the haptic feedback module; a first receiving terminal and a second receiving terminal of the transducer drive circuit are connected to the gesture capture module; the pixel drive circuit is connected to the display drive module; the display drive module is configured to control emitting elements of the display substrate to display images through the pixel drive circuit; and the gesture capture module is used to capture voltage signals generated by the ultrasonic transducer of the display substrate receiving ultrasonic echoes and generate gesture coordinate feedback to the host. The host computer is configured to analyze image object attributes corresponding to gesture coordinates, calculate each force focus point parameter and transmit it to the haptic feedback module, and the haptic feedback module is configured to control the ultrasonic transducer to generate acoustic focus points at positions of the gesture coordinates through the transducer drive circuit.

An embodiment of the present disclosure further provides a preparation method of a display substrate, including:

forming an array structure layer on a base substrate, wherein the array structure layer includes a transducer drive circuit;

forming a plurality of emitting units and a plurality of ultrasonic transducers disposed at intervals on the array structure layer, wherein the ultrasonic transducers are disposed between adjacent emitting units and connected to the transducer drive circuit;

wherein, the transducer drive circuit is configured to control the ultrasonic transducers to transmit ultrasonic waves and receive voltage signals generated by the ultrasonic transducer receiving ultrasonic echoes.

In some exemplary embodiments, a plurality of emitting units and a plurality of ultrasonic transducers disposed at intervals are formed on the array structure layer, including:

forming an ultrasonic transducer on a substrate;

forming an undercut structure located at a bottom of the ultrasonic transducer on the substrate.

In some exemplary embodiments, an undercut structure located at a bottom of the ultrasonic transducer is formed on the substrate, including:

through a patterning treatment, forming a plurality of grooves surrounding the ultrasonic transducer and being disposed at intervals on the substrate, etching the inside of the groove, and etching off the substrate at the bottom of the ultrasonic transducer using anisotropy of etching medium to form an undercut structure.

Other features and advantages of the present disclosure will be described in the subsequent description, and, in part, become apparent from the description, or may be understood by implementing the present disclosure. Objects and other advantages of the present disclosure may be implemented and obtained by structures specifically pointed out in the specification, claims and drawings.

Other aspects may be understood upon reading and understanding of the drawings and the detailed description.

BRIEF DESCRIPTION OF DRAWINGS

The drawings are used to provide a further understanding of technical solutions of the present disclosure and constitute a part of the description, which are used together with the embodiments of the present disclosure to explain the technical solutions of the present disclosure and do not constitute limitations on the technical solutions of the present disclosure.

DETAILED DESCRIPTION

Hereinafter, the embodiments of the present disclosure will be described in detail in combination with the accompanying drawings. In the case of no conflict, the embodiments in the present disclosure and the features in the embodiments may be randomly combined with each other.

A technology of haptic or tactile feedbacks may reproduce a tactile sensation for users through a series of actions such as force and vibration. This mechanical stimulation may be applied to an auxiliary creation and control of virtual scenes or virtual objects in computer simulation, and to strengthen a remote control for machinery and equipment.

Figure 1:
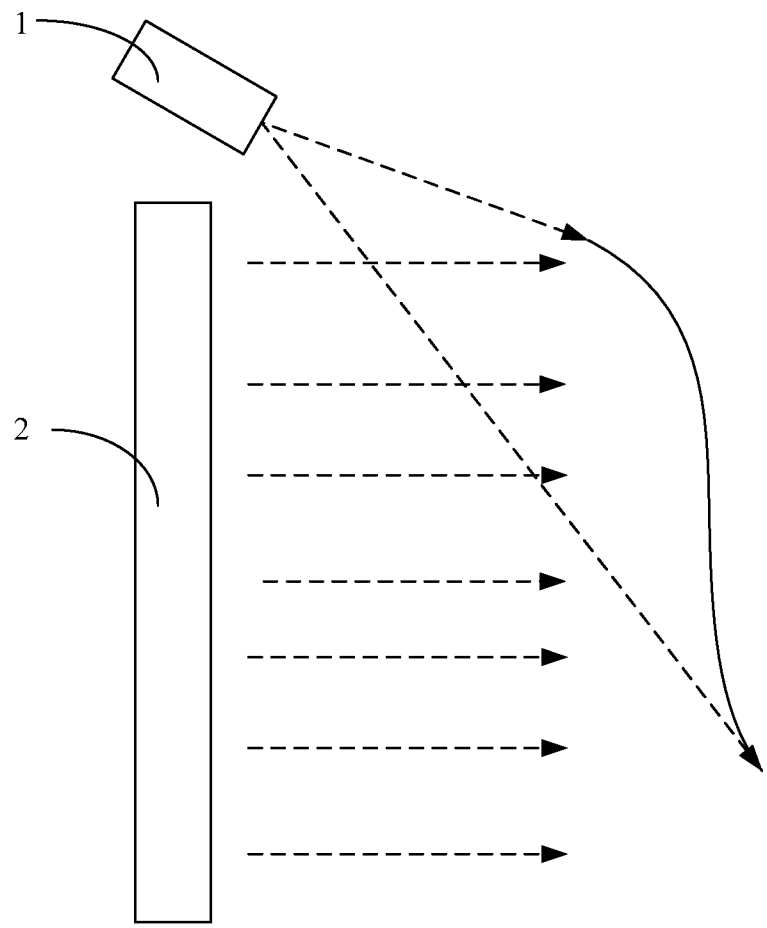
FIG. 1 is a display apparatus with a haptic feedback function.
Figure 2:
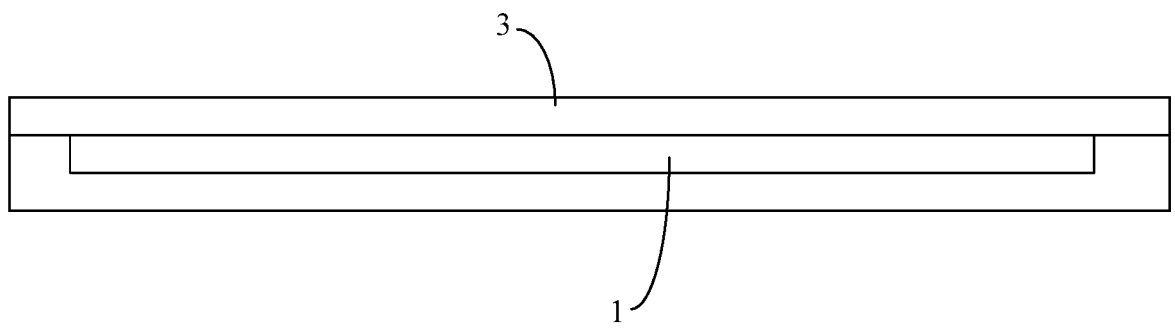
FIG. 2 is another display apparatus with a haptic feedback function.

FIG. 1 is a display apparatus with a haptic feedback function, and FIG. 2 is another display apparatus with a haptic feedback function. At present, there are two main ways to combine a haptic feedback apparatus 1 with a display apparatus. As shown in FIG. 1, the haptic feedback apparatus 1 is combined with a projection display apparatus 2. The haptic feedback apparatus 1 adopts a flat ultrasonic transducer, which forms an ultrasonic feedback region in the air. The projection display apparatus 2 projects a display screen on the ultrasonic feedback region, and gives a haptic feedback according to a physical property of an object at a touch position of the display screen of the projection display apparatus 2. As shown in FIG. 2, the haptic feedback apparatus 1 is combined with a display apparatus such as a mobile phone, and the haptic feedback apparatus 1 is disposed below a display screen 3, and a haptic feedback is given according to the physical property of the object at a touch position of a user on the display screen of the display screen 3. The haptic feedback apparatus 1 and the display apparatus shown in FIGS. 1 and 2 exist independently, and integration of the haptic feedback apparatus 1 and the display apparatus is not high, which seriously affects portability of the display apparatus.

A display substrate provided by the embodiment of the present disclosure, including a substrate, an array structure layer disposed on the substrate, a plurality of emitting units and a plurality of ultrasonic transducers disposed at intervals on a side of the array structure layer away from the substrate, wherein the ultrasonic transducers are disposed between adjacent emitting units; and the array structure layer includes a transducer drive circuit connected to the ultrasonic transducer, and the transducer drive circuit is configured to control the ultrasonic transducer to transmit ultrasonic waves and receive voltage signals generated by the ultrasonic transducer receiving ultrasonic echoes.

The embodiments of the present disclosure provide a display substrate. By disposing ultrasonic transducers between adjacent emitting units, the ultrasonic transducers are connected to the transducer drive circuit on the array structure layer, and transmit ultrasonic waves and receive ultrasonic echoes under the control of the transducer drive circuit to provide haptic feedback, thereby achieving an integration of haptic feedback and display.

A technical solution of a display substrate according to an embodiment of the present disclosure will be exemplarily illustrated below with reference to the accompanying drawings.

Figure 3A:
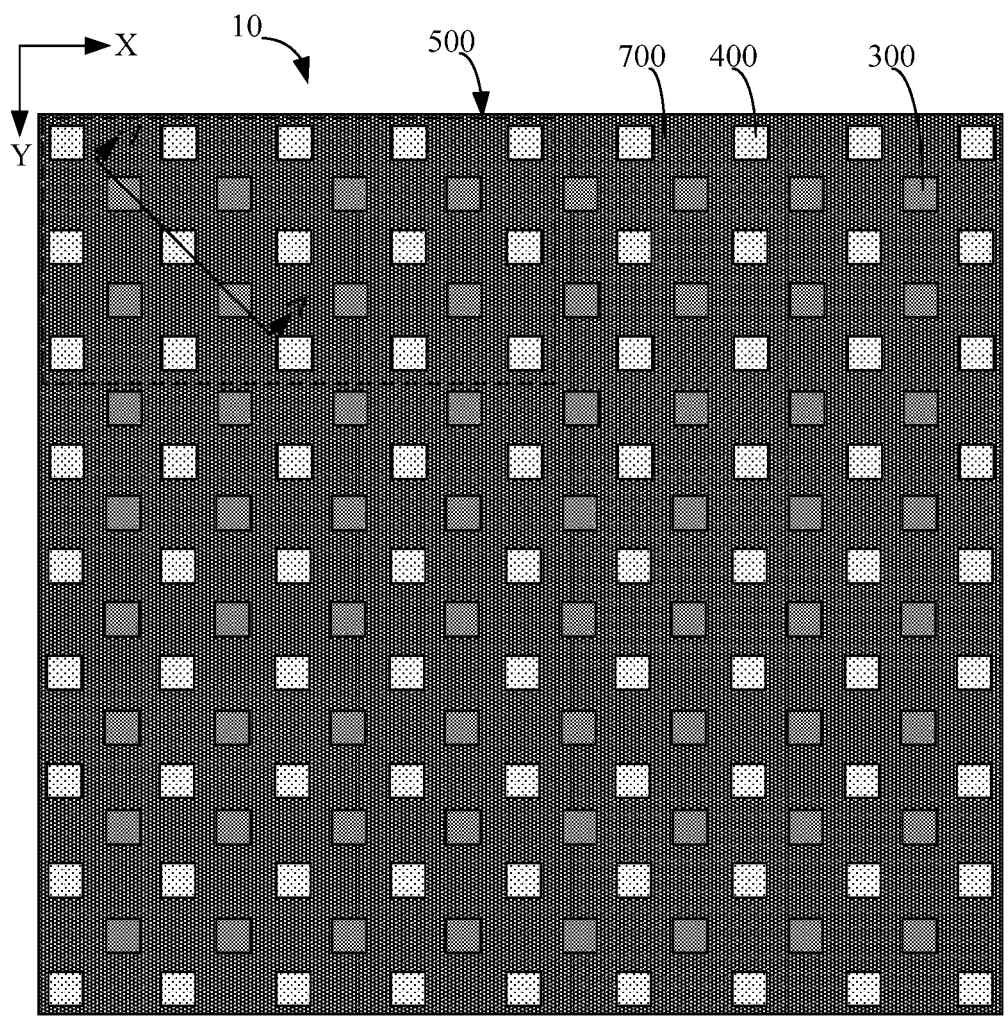
FIG. 3A is a plan view of a display substrate according to an exemplary embodiment of the present disclosure.
Figure 3B:
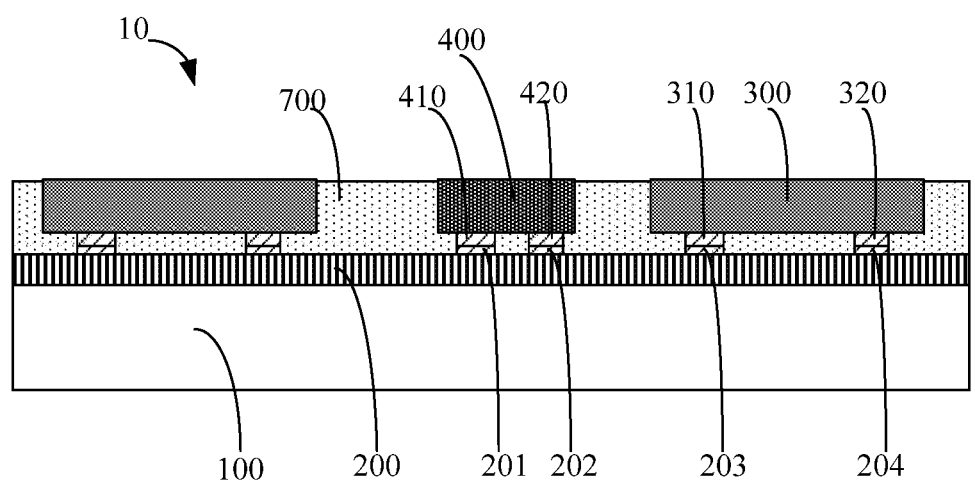
FIG. 3B is a sectional view at a position A-A in FIG. 3A.

FIG. 3A is a plan view of a display substrate according to an exemplary embodiment of the present disclosure, and FIG. 3B is a sectional view of a position A-A in FIG. 3. In some exemplary embodiments, as shown in FIGS. 3A and 3B, the display substrate 10 includes a substrate 100, an array structure layer 200 disposed on the substrate 100, and a plurality of emitting units 300 and a plurality of ultrasonic transducers 400 disposed at intervals on a side of the array structure layer 200 away from the substrate 100; the emitting units 300 are located at a display region of the display substrate 10, and the ultrasonic transducers 400 are disposed between adjacent light emitting units 300, that is the ultrasonic transducers 400 are also located at the display region of the display substrate 10; the array structure layer 200 includes a transducer drive circuit, which is connected to the ultrasonic transducers 400 and configured to control the ultrasonic transducers 400 to transmit ultrasonic waves to achieve haptic feedback, and receive voltage signals generated by the ultrasonic transducer 400 receiving ultrasonic echoes to determine a position of the touch control. The array structure layer 200 further includes a pixel drive circuit, which is connected to the emitting units 300 and controls the emitting units 300 to emit light to achieve screen display. The ultrasonic transducer 400 includes a first electrode 410 and a second electrode 420; a surface of the array structure layer 200 away from the substrate 100 is provided with a first binding pin 201 and a second binding pin 202, the first electrode 410 is fixed on the first binding pin 201, the second electrode 420 is fixed on the second binding pin 202, and the fixing method may be welding or bonding. The emitting unit 300 includes a third electrode 310 and a fourth electrode 320; a surface of the array structure layer 200 away from the substrate 100 is further provided with a third binding pin 203 and a fourth binding pin 204; the third electrode 310 is fixed on the third binding pin 203, and the fourth electrode 320 is fixed on the fourth binding pin 204 by welding or bonding.

An exemplary embodiment of the present disclosure provides a display substrate 10, including emitting units 300 and ultrasonic transducers 400; the emitting units 300 may achieve screen display under the control of a pixel drive circuit, and the ultrasonic transducers 400 may transmit ultrasonic waves and receive ultrasonic echoes under the control of a transducer drive circuit to provide haptic feedback, thereby achieving an integration of display and haptic feedback.

In some exemplary embodiments, as shown in FIG. 3A, the plurality of emitting units 300 include a plurality of rows of emitting units extending along a first direction X and disposed at intervals along a second direction Y and a plurality of columns of emitting units extending along the second direction Y and disposed at intervals along the first direction X, and the ultrasonic transducers 400 are disposed in a region surrounded by adjacent emitting unit 300 rows and adjacent emitting unit 300 columns. That is to say, an ultrasonic transducer 400 is adjacent to four surrounding emitting units 300, the ultrasonic transducer 400 is located at a center of a region surrounded by the four emitting units 300, or one emitting unit 300 is adjacent to four surrounding ultrasonic transducers 400, and is located at a center of a region surrounded by the four ultrasonic transducers 400.

Figure 4A:
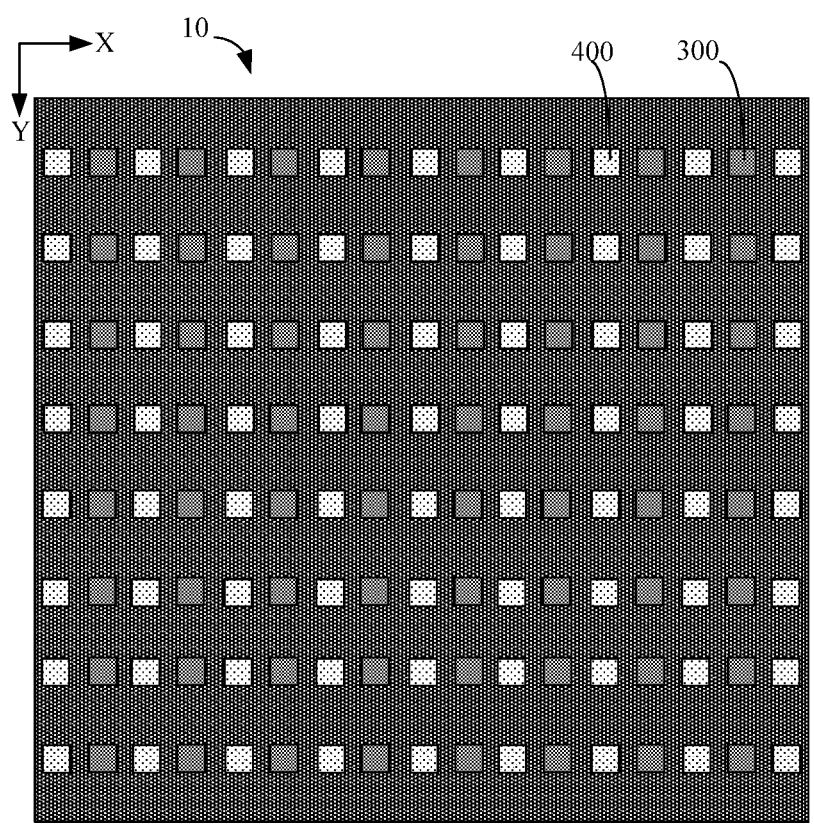
FIG. 4A is a plan view of another display substrate according to an exemplary embodiment of the present disclosure.
Figure 4B:
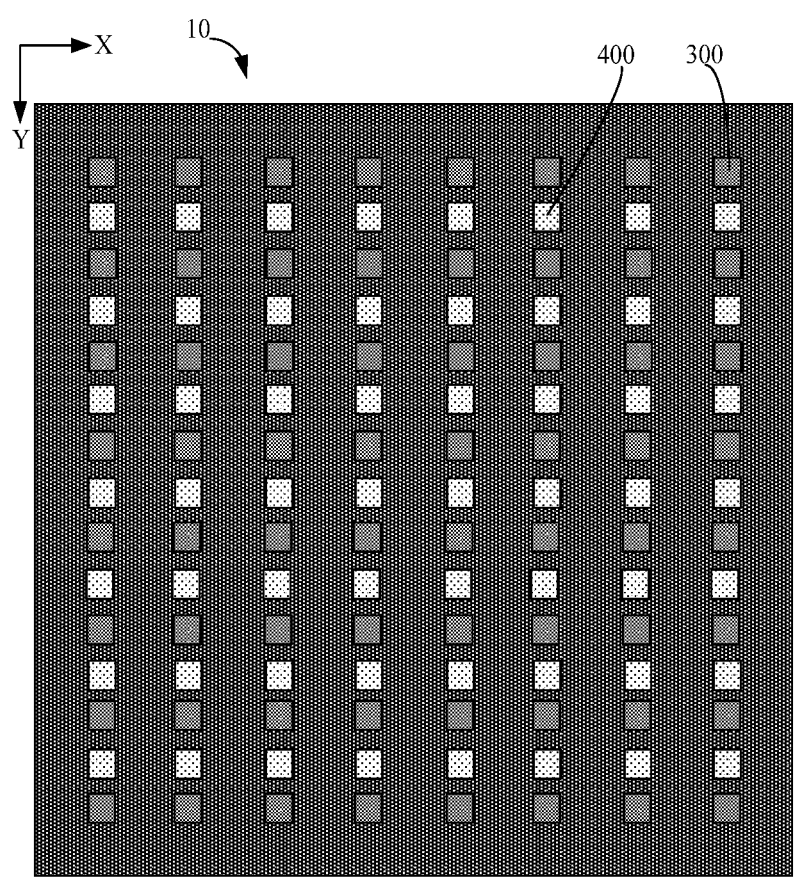
FIG. 4B is a plan view of another display substrate according to an exemplary embodiment of the present disclosure.
Figure 4C:
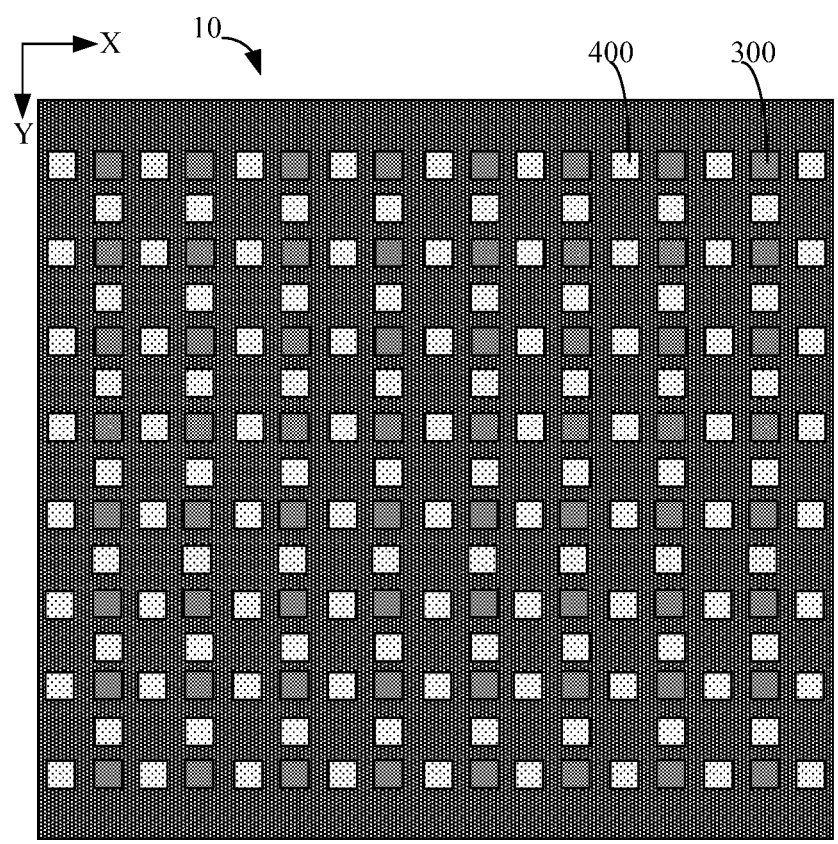
FIG. 4C is a plan view of another display substrate according to an exemplary embodiment of the present disclosure.

FIG. 4A is a plan view of another display substrate according to an exemplary embodiment of the present disclosure, and FIG. 4B is a plan view of another display substrate according to an exemplary embodiment of the present disclosure. In other exemplary embodiments, as shown in FIG. 4A, the ultrasonic transducer 400 is disposed between adjacent emitting units 300 in at least one row of the plurality of rows of emitting units 300. Or, as shown in FIG. 4B, the ultrasonic transducer 400 is disposed between adjacent emitting units 300 in at least one column of the plurality of columns of emitting units 300. Alternatively, as shown in FIG. 4C, the ultrasonic transducer 400 is disposed between adjacent emitting units 300 in at least one row of the plurality of rows of emitting units 300 and between adjacent emitting units 300 in at least one column of the plurality of columns of emitting units 300. In some exemplary embodiments, as shown in FIG. 3A, a plurality of ultrasonic transducers 400 are divided into a plurality of array elements 500, and the transducer drive circuit includes a plurality of transducer sub-drive circuits, and the array elements 500 are correspondingly connected to the transducer sub-drive circuits. In FIG. 1, a plurality of ultrasonic transducers 400 included in a region enclosed by a dashed line frame form an array element 500, and the ultrasonic transducers 400 in an array element 500 are controlled by a corresponding transducer driver circuit. The number of ultrasonic transducers 400 in an array element 500 may be 4, 6, 8, 12 or 36, etc. In order to get a more realistic haptic experience, the existing ultrasonic haptic feedback technology uses three or four hundred ultrasonic transducers 400 to form an ultrasonic array to act together on the focus point to exert force. Because each ultrasonic transducer 400 is controlled independently, the drive circuit is extremely large. In this example, the ultrasonic transducer 400 is divided into a plurality of array elements 500, and the ultrasonic transducers 400 in the array elements 500 are controlled by a transducer drive circuit. Therefore, an overall quantity of transducer drive circuits is reduced by N/n times, and a complexity of the transducer drive circuit is reduced, wherein N is the quantity of ultrasonic transducers 400 and n is the quantity of array elements 500.

Figure 5:
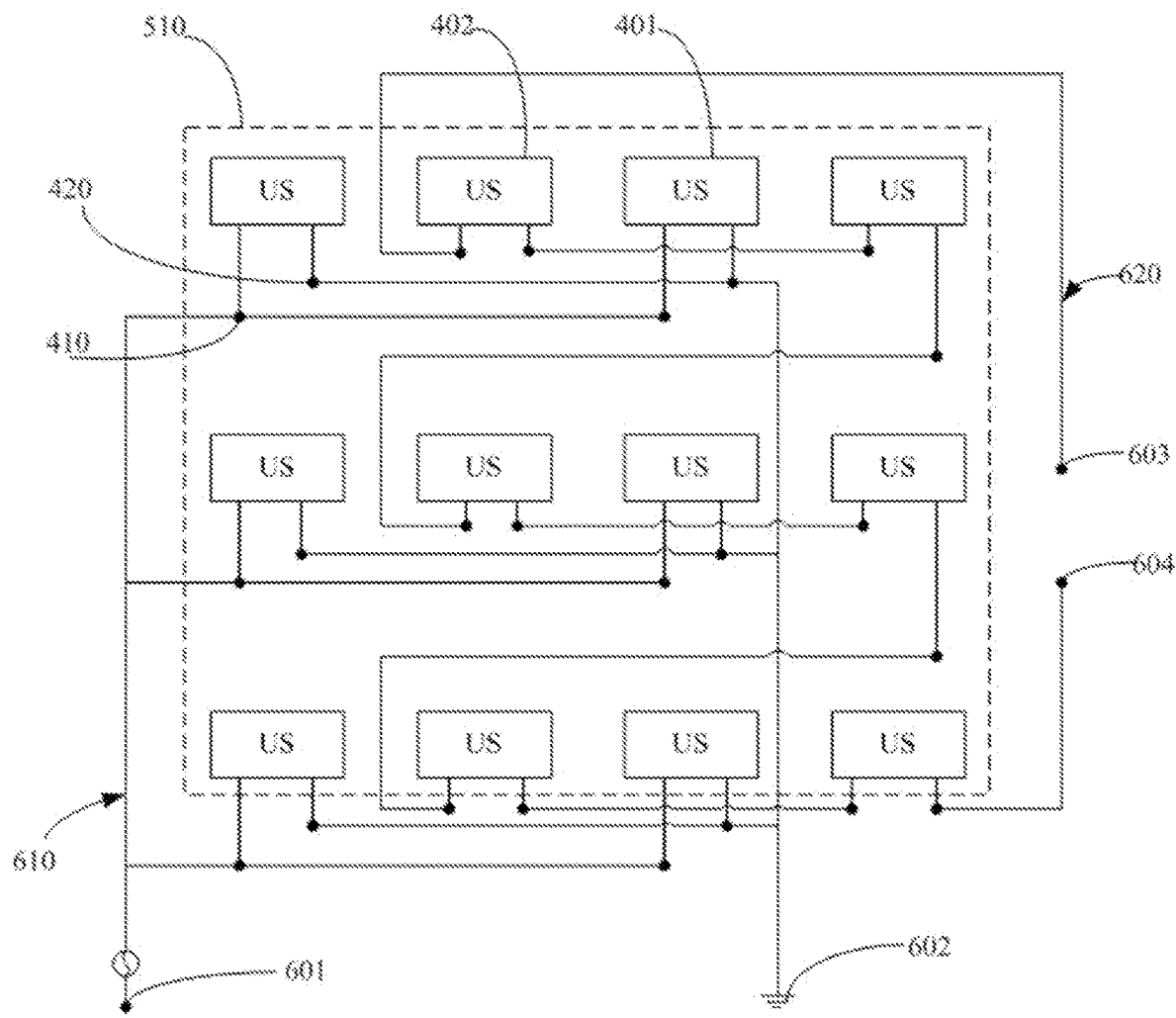
FIG. 5 is a circuit diagram of a transducer sub-drive circuit according to an exemplary embodiment of the present disclosure.

FIG. 5 is a circuit diagram of a transducer sub-drive circuit according to an exemplary embodiment of the present disclosure. In some exemplary embodiments, a plurality of array elements 500 include a first array element 510, and the ultrasonic transducers 400 of the first array element 510 include a plurality of first ultrasonic transducers 401 for transmitting ultrasonic waves and a plurality of second ultrasonic transducers 402 for receiving ultrasonic echoes, the transducer sub-drive circuit corresponding to the first array element 510 includes an ultrasonic transmitting circuit 610 connected to a plurality of first ultrasonic transducers 401 and an ultrasonic receiving circuit 620 connected to a plurality of second ultrasonic transducers 402. That is to say, the transducer sub-circuit corresponding to the first array element 510 is a transmission-reception separation circuit, the first ultrasonic transducer 401 is used to transmit ultrasonic waves under the control of the ultrasonic transmitting circuit 610, and the second ultrasonic transducer 402 is used to receive ultrasonic echoes under the control of the ultrasonic receiving circuit.

As shown in FIG. 5, in some exemplary embodiments, first ultrasonic transducers 401 and second ultrasonic transducers 402 are alternately disposed in a first direction X. In other exemplary embodiments, the first ultrasonic transducers 401 and the second ultrasonic transducers 402 are alternately disposed in a second direction Y. The first ultrasonic transducers 401 and the second ultrasonic transducers 402 are alternately disposed in the first direction X or the second direction Y, which may ensure accuracy of touch position recognition and improve an experience of haptic feedback.

As shown in FIG. 5, in some exemplary embodiments, the ultrasonic transducer 400 includes a first electrode 410 and a second electrode 420, and the ultrasonic transmitting circuit 610 includes a first power terminal 601 and a second power terminal 602, wherein the first power terminal 601 is connected to first electrodes 410 of a plurality of first ultrasonic transducers 401, and is configured to supply AC voltage to the first ultrasonic transducers 401 to achieve AC excitation. The second power terminal 602 is connected to the second electrodes 420 of the plurality of first ultrasonic transducers 401. The second power terminal 602 may be a ground terminal. In other exemplary embodiments, the first power terminal 601 may alternatively provide DC bias, so that restoring force and electrostatic force of a thin film of the ultrasonic transducer 400 are balanced. The display substrate 10 includes a binding region located at a side of the display region, and the first power terminal 601 and the second power terminal 602 may be led out to the binding region. Therefore, a transducer drive circuit of the display substrate 10 includes a plurality of first power terminals 601 and a plurality of second power terminals 602 led out to the binding region, and the first array element 510 corresponds to at least one first power terminal 601 and one second power terminal 602.

As shown in FIG. 3A, in some exemplary embodiments, an ultrasonic transducer 400 includes a first electrode 410 and a second electrode 420, and a plurality of second ultrasonic transducers 402 are connected in series, wherein a second electrode 420 of a second ultrasonic transducer 402 located at a head end is connected to a first electrode 410 of an adjacent second ultrasonic transducer 402, a first electrode 410 of a second ultrasonic transducer 402 at a tail end is connected to a second electrode 420 of an adjacent second ultrasonic transducer 402. The ultrasonic receiving circuit 620 includes a first receiving terminal 603 connected to a first electrode 410 of a second ultrasonic transducer 402 at a head end and a second receiving terminal 604 connected to a second electrode 420 of a second ultrasonic transducer 402 at a tail end. The display substrate 10 includes a binding region located at a side of the display region, and the first receiving terminal 603 and the second receiving terminal 604 may be led out to the binding region. Therefore, a transducer drive circuit of the display substrate 10 includes a plurality of first receiving terminals 603 and second receiving terminals 604 led out to the binding region, and the first array element 510 corresponds to at least one first receiving terminal 603 and one second receiving terminal 604.

Figure 6:
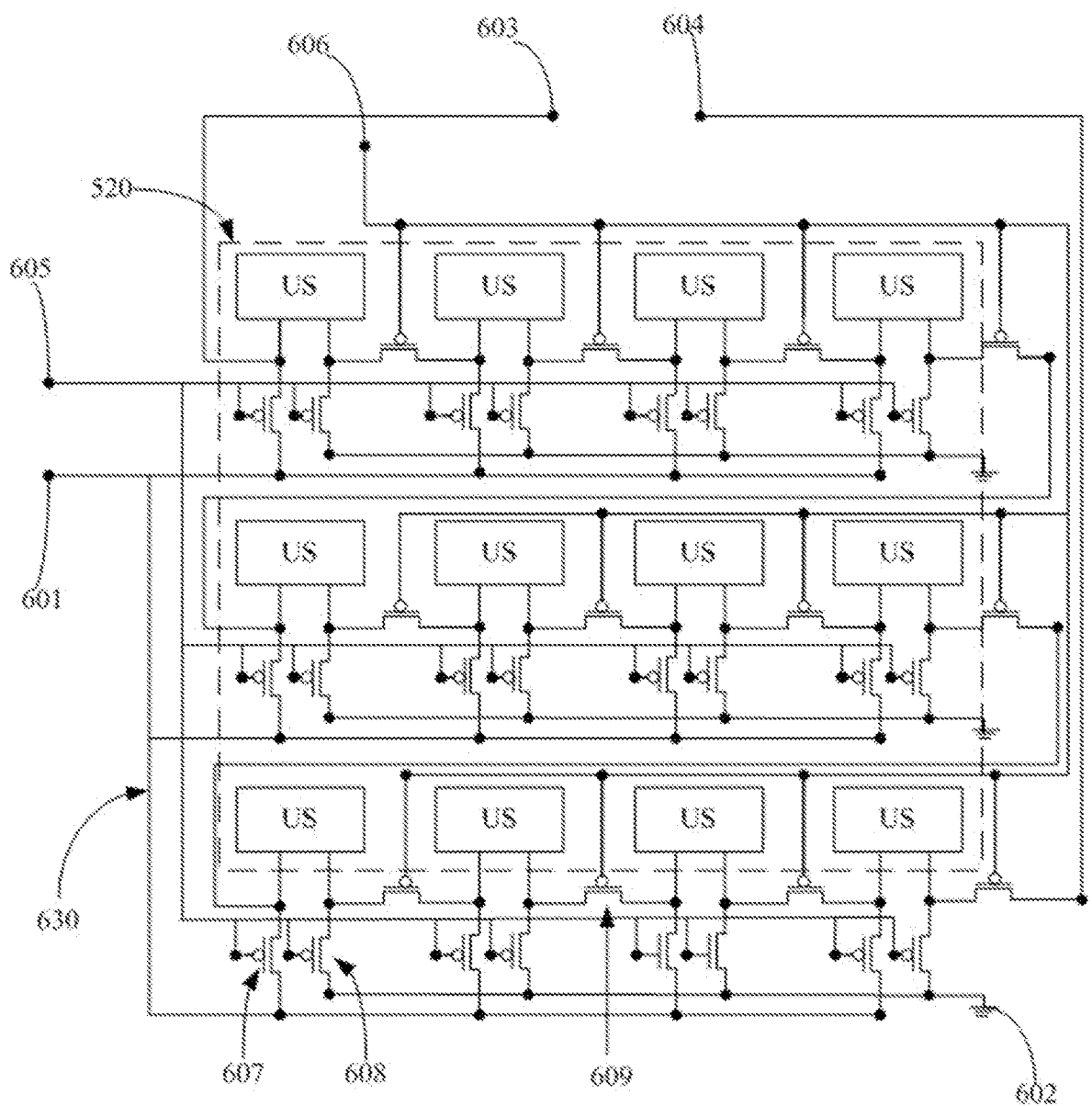
FIG. 6 is a circuit diagram of another transducer sub-drive circuit according to an exemplary embodiment of the present disclosure.

FIG. 6 is a circuit diagram of another transducer sub-drive circuit according to an exemplary embodiment of the present disclosure. In some exemplary embodiments, as shown in FIG. 6, a plurality of array elements 500 include a second array element 520, a transducer drive circuit includes a transmission-reception integrated circuit 630 correspondingly connected to the second array element 520, and an ultrasonic transducer 400 includes a first electrode 410 and a second electrode 420; the transmission-reception integrated circuit 630 includes a first power terminal 601, a second power terminal 602, a first receiving terminal 603, a second receiving terminal 604, a first scan terminal 605, a second scan terminal 606, a plurality of first switch transistors 607, a plurality of second switch transistors 608 and a plurality of third switch transistors 609, wherein the first switch transistors 607, and the second switch transistors 608 correspond to the ultrasonic transducer 400; a first electrode of the first switch transistor 607 is connected to a first electrode 410 of a corresponding ultrasonic transducer 400;

a second electrode of the first switch transistor 607 is connected to the first power terminal 601, a control electrode of the first switch transistor 607 is connected to the first scan terminal 605, and a first electrode of the second switch transistor 608 is connected to a second electrode 420 of a corresponding ultrasonic transducer 400; a second electrode of the second switch transistor 608 is connected to the second power terminal 602; a control electrode of the second switch transistor 608 is connected to the first scan terminal 605; a plurality of third switch transistors 609 are alternately connected in series with a plurality of ultrasonic transducers 400; a first electrode of the third switch transistor 609 is connected to a second electrode of a corresponding ultrasonic transducer 400; a second electrode of the third switch transistor 609 is connected to a first electrode 410 of a corresponding ultrasonic transducer 400; a control electrode of the third switch transistor 609 is connected to the second scan terminal 606; a first electrode of the ultrasonic transducer 400 at a head end is connected to the first receiving terminal 603; and a second electrode of the ultrasonic transducer 400 at a tail end is connected to the second receiving terminal 604. The first power terminal 601 may provide AC voltage to achieve AC excitation, and the first power terminal 601 may alternatively provide DC bias. The second power terminal 602 may be a ground terminal. The first electrode of the first switch transistor 607, the first electrode of the second switch transistor 608 and the first electrode of the third switch transistor 609 may be source electrodes, and the second electrode of the first switch transistor 607, the second electrode of the second switch transistor 608 and the second electrode of the third switch transistor 609 may be drain electrodes. Alternatively, the first electrode of the first switch transistor 607, the first electrode of the second switch transistor 608, the first electrode of the third switch transistor 609 may be drain electrodes; the second electrode of the first switch transistor 607, the second electrode of the second switch transistor 608 and the second electrode of the third switch transistor 609 may be source electrodes; and the control electrode of the first switch transistor 607, the control electrode of the second switch transistor 608, and the control electrode of the third switch transistor 609 may be gates. In this example, the transmission-reception integrated circuit 630 uses a time division multiplexing control mode. In a first time, a first scan terminal 605 may input a first control voltage, a first switch transistor 607 and a second switch transistor 608 are turned on at the same time, both the first power terminal 601 and the second power terminal 602 are connected to an ultrasonic transducer 400; the first power terminal 601 inputs an AC voltage, and an ultrasonic transducer 400 generates and emits ultrasonic waves under an action of AC excitation. The emitted ultrasonic waves may be used as touch signals or may be used as haptic feedback. In a second time, the first scan terminal 605 stops inputting a first control voltage, the first switch transistor 607 and the second switch transistor 608 are turned off, a second scan terminal 606 inputs a second control voltage, a third switch transistor 609 is turned on, and the first receiving terminal 603 and the second receiving terminal 604 are both connected to the ultrasonic transducer 400. The ultrasonic transducer 400 receives ultrasonic echo and generate voltage signals, and outputs the voltage signals through the first receiving terminal 603 and the second receiving terminal 604 to achieve determining a touch position. Because the first switch transistor 607 and the second switch transistor 608 are disposed in the ultrasonic transmitting circuit 610 for controlling an on and off between the ultrasonic transducer 400 and the first power terminal 601, and for controlling an on and off between the ultrasonic transducer 400 and the second power terminal 602, so the first switch transistor 607 and the second switch transistor 608 may be called transmitting transistors. Because the third switch transistor 609 is disposed in the ultrasonic receiving circuit 620 for controlling an on and off between the ultrasonic transducer 400 and the first receiving terminal 603, and for controlling an on and off between the ultrasonic transducer 400 and the second receiving terminal 604, so the third switch transistor 609 may be called a receiving transistor. The first power terminal 601, the second power terminal 602, the first receiving terminal 603, the second receiving terminal 604, the first scan terminal 605 and the second scan terminal 606 may be led out to the binding region. Therefore, the transducer drive circuit of the display substrate 10 includes a plurality of first power terminals 601, a plurality of second power terminals 602, a plurality of first receiving terminals 603, a plurality of second receiving terminals 604, a plurality of first scan terminals 605 and a plurality of second scan terminals 606 led out to the binding region.

In some exemplary embodiments, a plurality of array elements 500 may all be first array elements 510, or may all be second array elements 520, or the plurality of array elements 500 may include the first array elements 510 and the second array elements 520.

In some exemplary embodiments, the emitting unit 300 may be made of LEDs, such as Mini LED and μLED, and an ultrasonic transducer 400 may be capacitive micromachined ultrasonic transducers (CMUT), and the CMUT is a micron-sized ultrasonic transducer 400. The emitting unit 300 and the ultrasonic transducer 400 may be printed on corresponding binding pins of an array structure layer 200 by Micro-Transfer-Printing (μTP).

In some exemplary embodiments, as shown in FIG. 3B, the display substrate 10 further includes a light shielding layer 700 disposed on a side of the array structure layer 200 away from the substrate 100, the light shielding layer 700 is provided with a first opening and a second opening, the emitting unit 300 is disposed in the first opening, and the ultrasonic transducer 400 is disposed in the second opening. The first opening may also be called a pixel opening, and the light shielding layer 700 is used to define a pixel region.

In some exemplary embodiments, the display substrate 10 further includes a light shielding layer 700 disposed on a side of the array structure layer 200 away from the substrate 100, and the light shielding layer 700 covers a region of the array structure layer 200 away from the substrate 100 except the emitting unit 300 and the ultrasonic transducer 400. The light shielding layer 700 may be a black potting adhesive.

A preparation process of the display substrate will be exemplarily described below. Coating described in the exemplary embodiment of the present disclosure may be any one or more of spray coating, spin coating and ink-jet printing, and the etching may be any one or more of dry etching and wet etching.

The exemplary embodiment of the present disclosure shows that the preparation of the display substrate includes preparation of the array substrate, preparation of the ultrasonic transducer, preparation of the emitting unit, and micro-transfer printing and encapsulation of the ultrasonic transducer and the emitting unit. Wherein, there is no particular order for the preparation of array substrate, the preparation of ultrasonic transducer and the preparation of emitting unit, which may be carried out at the same time.

Figure 7:
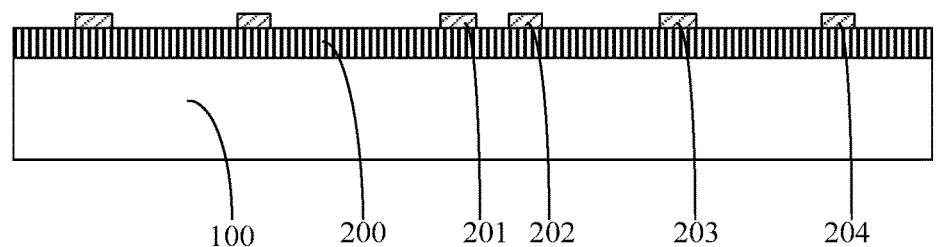
FIG. 7 is a schematic diagram of a structure of forming an array substrate according to an exemplary embodiment of the present disclosure.

I. Preparation of an Array Substrate (1) Forming an array structure layer 200 on a substrate 100. As shown in FIG. 7, the array structure layer 200 includes a pixel drive circuit and a transducer drive circuit; a first binding pin 201, a second binding pin 202, a third binding pin 203 and a fourth binding pin 204 are disposed on a side of the array structure layer 200 away from the substrate 100; the first binding pin 201 and the second binding pin 202 are correspondingly connected to the transducer drive circuit; and the third binding pin 203 and the fourth binding pin 204 are correspondingly connected to the pixel drive circuit. FIG. 7 is a schematic diagram of a structure of forming an array substrate according to an exemplary embodiment of the present disclosure.

Figure 8:
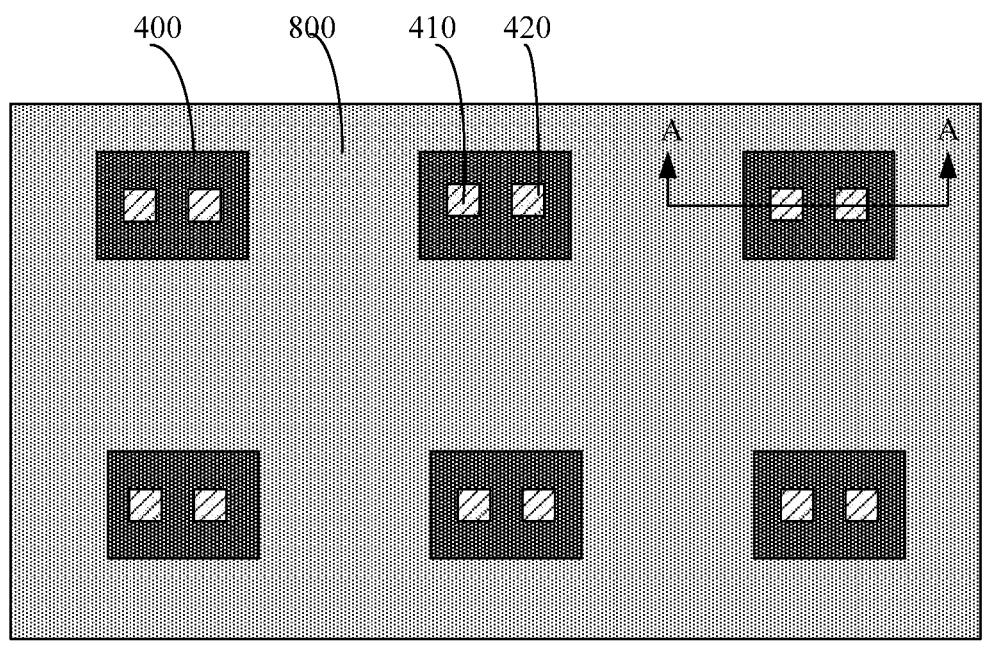
FIG. 8 is a plan view of forming an ultrasonic sensor according to an exemplary embodiment of the present disclosure.
Figure 9:
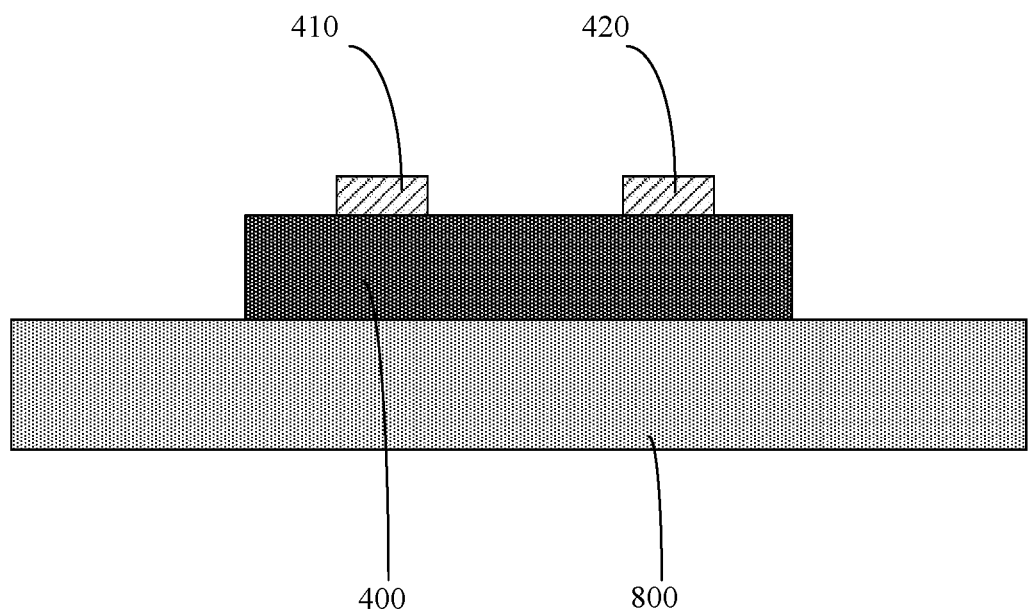
FIG. 9 is a sectional view at a position A-A in FIG. 8.

II. Preparation of Ultrasonic Transducer (1) Forming an array of ultrasonic transducers 400 on a substrate 800. As shown in FIGS. 8 and 9, the ultrasonic transducer 400 includes a first electrode 410 and a second electrode 420, which are located on a side of the ultrasonic transducer 400 away from the substrate 800. The substrate may be a silicon-based substrate. FIG. 8 is a plan view of forming an ultrasonic sensor according to an exemplary embodiment of the present disclosure, and FIG. 9 is a sectional view of a position A-A in FIG. 8.

Figure 10:
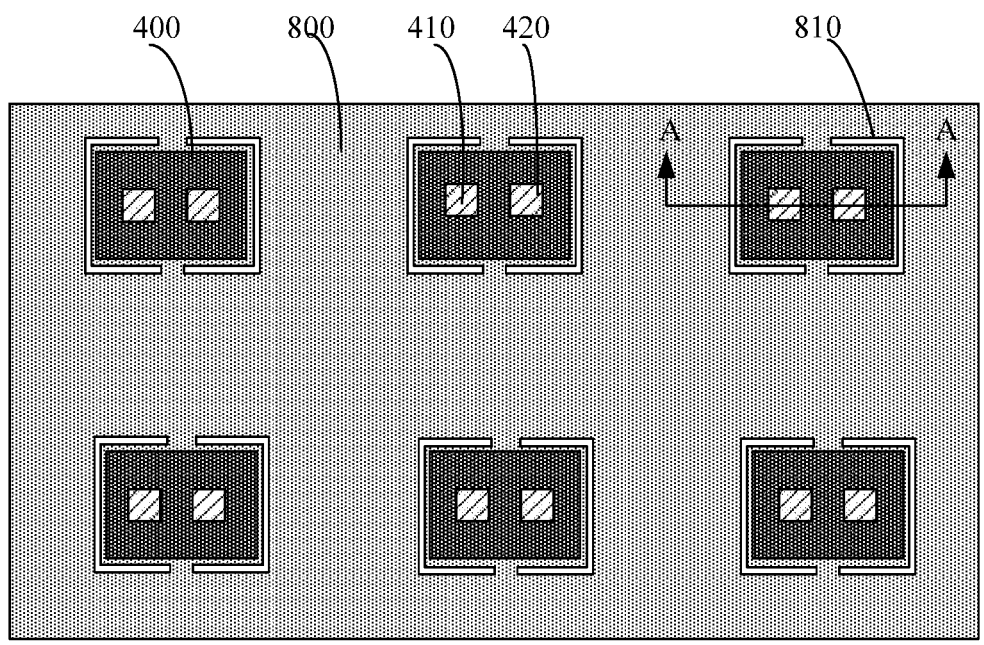
FIG. 10 is a plan view of forming an undercut structure according to an exemplary embodiment of the present disclosure.
Figure 11:
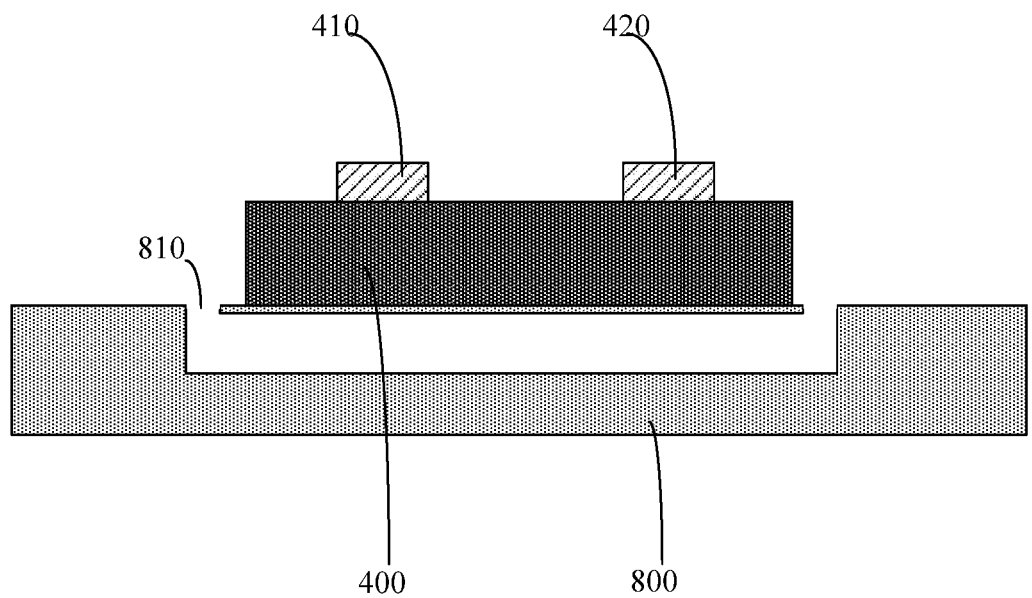
FIG. 11 is a sectional view at position A-A in FIG. 10.

(2) Forming an undercut structure located at a bottom of the ultrasonic transducer 400 on the substrate 800. Forming the undercut structure at a bottom of the ultrasonic transducer 400 includes, as shown in FIGS. 10 and 11, by patterning process, forming a plurality of grooves 810 disposed at intervals surrounding the ultrasonic transducer 400 on the substrate 800 where the ultrasonic transducer 400 is formed, etching the inside of the grooves 810, and etching off the substrate 800 at the bottom of the ultrasonic transducer 400 by using the anisotropy of etching medium to form an undercut structure.

The grooves may be two, three or four, which are disposed at equal intervals in a circumferential direction of the ultrasonic transducer 400, and the interval between adjacent grooves 810 forms a cantilever supporting the ultrasonic transducer 400. The etching medium may be liquid phase medium or gas phase medium. After forming the groove 810, the mask for forming the groove 810 is not peeled off. The formed undercut structure may reduce the binding force between the ultrasonic transducer 400 and the substrate 800 and facilitate the transfer of the ultrasonic transducer 400. FIG. 10 is a plan view of forming an undercut structure according to an exemplary embodiment of the present disclosure; FIG. 11 is a sectional view at a position A-A in FIG. 10.

III. Preparation of emitting units, Mini LED is adopted in an emitting unit 300, including a third electrode 310 and a fourth electrode 320. A preparation process of the emitting units 300 may not be described here in detail, and the existing Mini LED structure may be adopted.

IV. Transferring Printing the Ultrasonic Transducer and the Emitting Unit to the Array Substrate (1) Coating a bonding conductive adhesive on a first binding pin 201, a second binding pin 202, a third binding pin 203 and a fourth binding pin 204.

Figure 12:
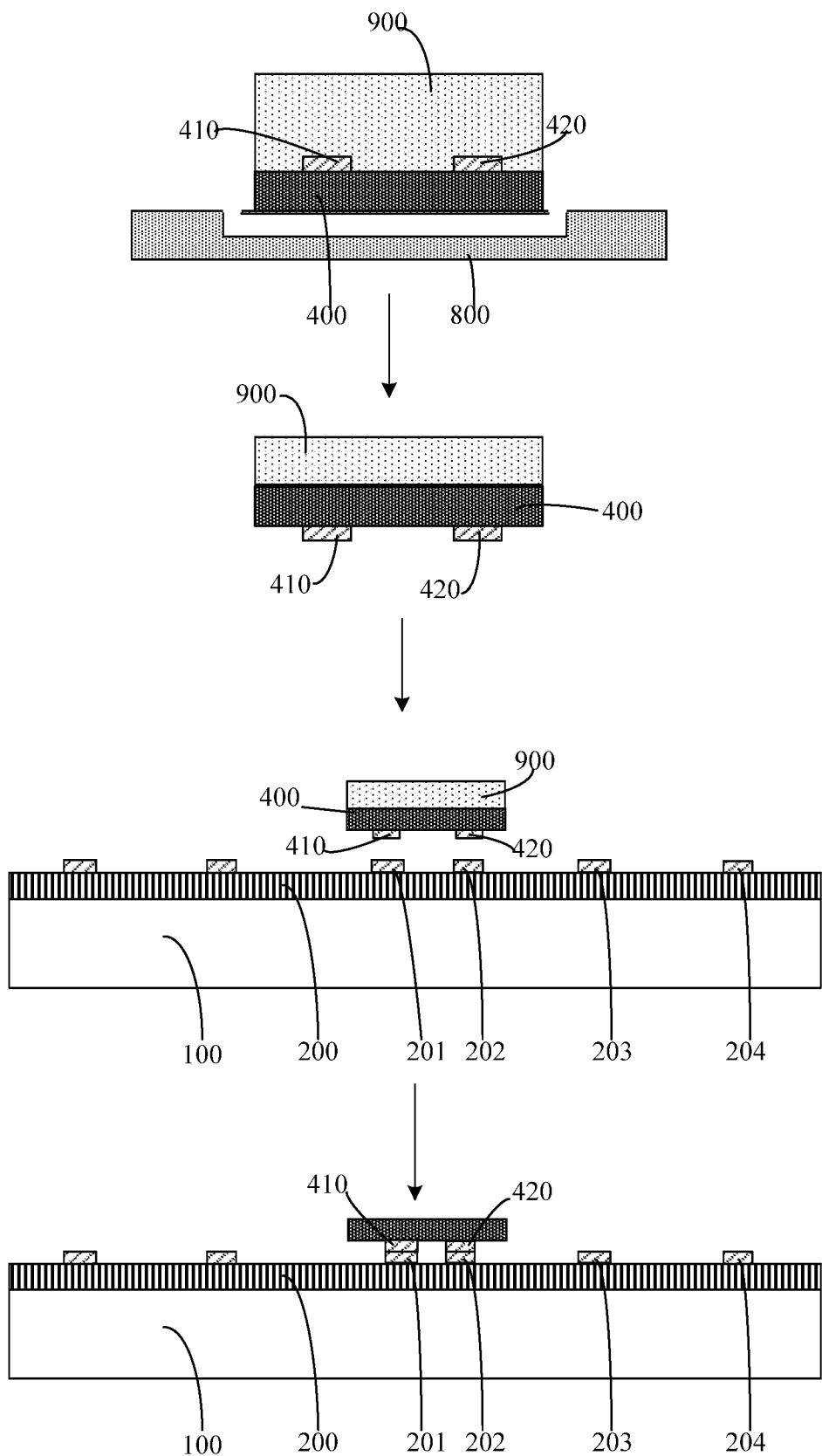
FIG. 12 is a diagram of a transfer printing process of an ultrasonic transducer according to an exemplary embodiment of the present disclosure.
Figure 13:
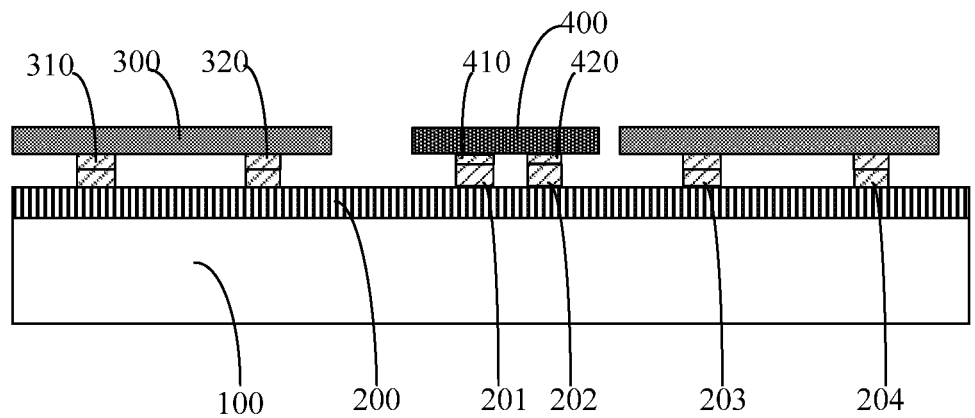
FIG. 13 is a diagram of a structure of an emitting unit after transfer printing according to an exemplary embodiment of the present disclosure.

(2) Transferring printing an ultrasonic transducer 400. Transferring printing the ultrasonic transducers 400 includes: as shown in FIG. 12, the array substrate is placed on a transfer printing table, a transfer printing head 900 picks up the ultrasonic transducers 400 in batches from the substrate 800, turns over the ultrasonic transducers 400 so that the first electrode 410 and the second electrode 420 are located on a side of the ultrasonic transducer 400 away from the transfer printing head 900, and then transfers them to the top of the array substrate, through an alignment system, the first electrode 410 of the ultrasonic transducer 400 corresponds to the first binding pin 201 and the second electrode 420 corresponds to the second binding pin 202, so that the ultrasonic transducer 400 is released, the first electrode 410 is bonded to the first binding pin 201, the second electrode 420 is bonded to the second binding pin 202. Release the ultrasonic transducer 400, the first electrode 410 is bonded to the first binding pin 201 and the second electrode 420 is bonded to the second binding pin 202. In an exemplary embodiment, the transfer printing head 900 picking up the ultrasonic transducers 400 in batches from the substrate 800 includes: quickly pressing down the transfer printing head 900 to deform and closely adhering to the ultrasonic transducers 400, and then quickly lifting up and pulling up the ultrasonic transducers 400. In another exemplary embodiment, releasing the ultrasonic transducer 400 includes: quickly pressing down, the transfer printing head 900 will tilt slightly to a side, then slowly lifting up, the transfer printing head 900 will recover from the deformation and separating from the ultrasonic transducer 400 to complete the transfer printing. FIG. 12 is a diagram of a transfer process of an ultrasonic transducer according to an exemplary embodiment of the present disclosure;

(3) Transferring printing the emitting unit 300. A transfer printing process of the emitting unit 300 is substantially the same as that of the ultrasonic transducer 400, which is not repeated here in detail. After the transfer printing is completed, as shown in FIG. 13, a third electrode 310 of the emitting unit 300 is bonded to the third binding pin 203, and a fourth electrode 320 of the emitting unit 300 is bonded to the fourth binding pin 204. FIG. 13 is a diagram of a structure of an emitting unit after being transferred printing according to an exemplary embodiment of the present disclosure.

In other exemplary embodiments, before transferring the ultrasonic transducer 400 and the emitting unit 300, coating flux on the first binding pin 201, the second binding pin 202, the third binding pin 203 and the fourth binding pin 204 are further included, and heating the flux when transferring printing the ultrasonic transducer 400 and the emitting unit 300, so that the first electrode 410 is welded with the first binding pin 201; the second electrode 420 is welded with the second binding pin 202; the third electrode 310 is welded with the third binding pin 203; and the fourth electrode 320 is welded with the fourth binding pin 204.

V. Encapsulation

Forming a light shielding layer 700 on a side of the array structure layer 200 away from the substrate 100 by ink-jet printing, wherein, the light shielding layer 700 covers a region of the array structure layer 200 away from the substrate 100 except the emitting units 300 and the ultrasonic transducers 400. After the encapsulation, the display substrate 10 is formed as shown in FIG. 3B.

In other exemplary embodiments, the light shielding layer 700 may be formed on the array substrate first, and the light shielding layer 700 is provided with a first opening exposing the first binding pin 201 and the second binding pin 202 and a second opening exposing the third binding pin 203 and the fourth binding pin 204. Forming the light shielding layer 700 on the array substrate includes coating a light shielding film on a side of the array structure layer 200 away from the substrate 100, and forming the light shielding layer 700 after masking, exposing and developing, wherein the light shielding layer 700 is provided with a first opening exposing the first binding pin 201 and the second binding pin 202 and a second opening exposing the third binding pin 203 and the fourth binding pin 204.

It may be seen from the preparation process of the display substrate 10 according to the exemplary embodiment of the present disclosure that the ultrasonic transducer 400 may be transferred printing to the array substrate through micro-transfer by forming the first binding pin 201 and the second binding pin 202 connected to the transducer drive circuit and the third binding pin 203 and the fourth binding pin 204 connected to the pixel drive circuit on the array structure layer 200 of the array substrate. The first electrode 410 is connected to the first binding pin 201, the second electrode 420 is connected to the second binding pin 202, the emitting unit 300 is transferred printing to the array substrate by micro-transfer, the third electrode 310 is connected to the third binding pin 203, and the fourth electrode 320 is connected to the fourth binding pin 204. The ultrasonic transducer 400 may achieve haptic feedback under the control of transducer drive circuit, and the emitting unit 300 may achieve screen display under the control of the pixel drive circuit, and further achieve an integration of haptic feedback and display.

An embodiment of the present disclosure further provides a preparation method of a display substrate, including:

forming an array structure layer on a substrate, wherein the array structure layer includes a transducer drive circuit;

forming a plurality of emitting units and a plurality of ultrasonic transducers disposed at intervals on the array structure layer, wherein the ultrasonic transducers are disposed between adjacent emitting units and connected to the transducer drive circuit;

wherein, the transducer drive circuit is configured to control the ultrasonic transducer to transmit ultrasonic waves and receive voltage signals generated by the ultrasonic transducer receiving ultrasonic echoes.

In some exemplary embodiments, a plurality of emitting units and a plurality of ultrasonic transducers disposed at intervals are formed on the array structure layer, including:

forming an ultrasonic transducer on a substrate;

forming an undercut structure located at a bottom of the ultrasonic transducer on the substrate.

In some exemplary embodiments, an undercut structure located at a bottom of the ultrasonic transducer is formed on the substrate, including:

through a patterning treatment, forming a plurality of grooves being disposed at intervals and surrounding the ultrasonic transducer on the substrate, etching the inside of the groove, and etching off the substrate at the bottom of the ultrasonic transducer using anisotropy of etching medium to form an undercut structure.

An embodiment of the present disclosure further provides a display apparatus including the display substrate of the aforementioned embodiment. The display apparatus may be any product or component with a display function and needs to be provided with tactile feedback function, such as a mobile phone, a tablet, a television, a display, a laptop or a digital photo frame.

Figure 14:
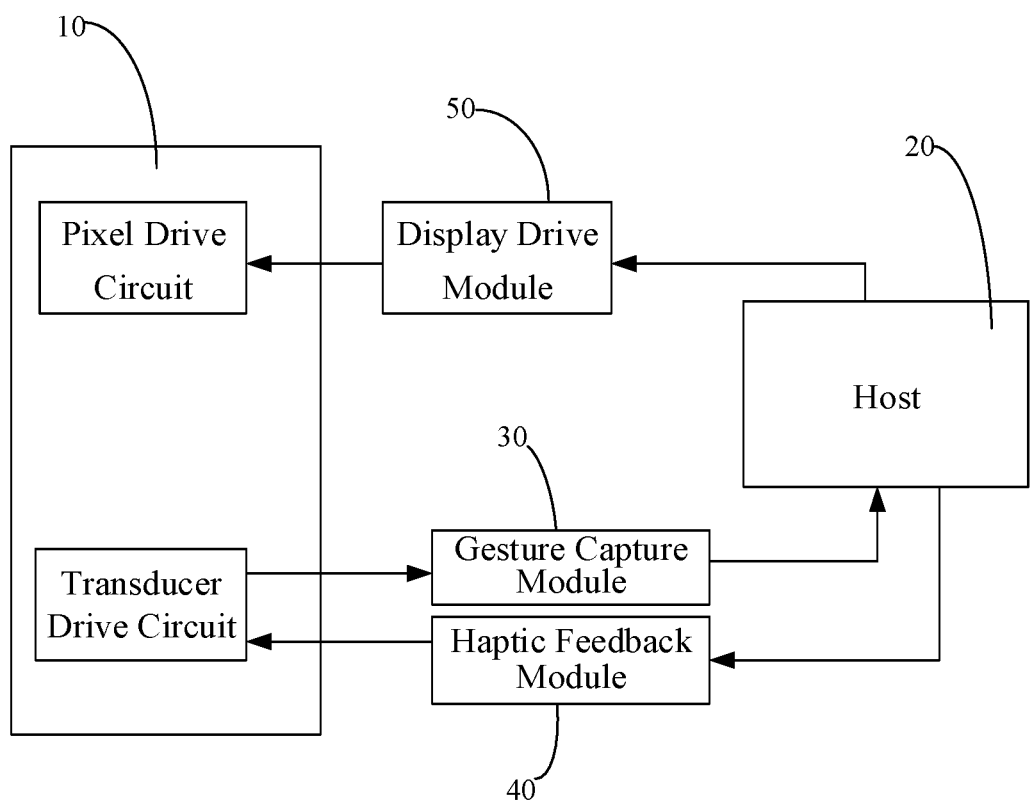
FIG. 14 is a schematic diagram of a structure of a display apparatus according to an embodiment of the present disclosure.

FIG. 14 is a schematic diagram of a structure of a display apparatus according to an embodiment of the present disclosure. In some exemplary embodiments, as shown in FIG. 14, the display apparatus further includes a host computer 20, a gesture capturing module 30, a haptic feedback module 40 and a display drive module 50 connected to the host computer 20, wherein the display substrate includes a transducer drive circuit connected to the ultrasonic sensor and a pixel drive circuit connected to the light emitting element; a first power terminal and a second power terminal of the transducer drive circuit are connected to the haptic feedback module 40; a first receiving terminal and a second receiving terminal of the transducer drive circuit are connected to a gesture capture module 30; the pixel drive circuit is connected to the display drive module 50; the display drive module 50 is configured to control emitting elements of the display substrate 10 to display pictures through the pixel drive circuit, and the gesture capture module 30 is used for capturing voltage signals generated by receiving ultrasonic echoes from the display substrate 10 and generating gesture coordinates for feedback to the host computer 20. The host computer 20 is configured to analyze image object attributes corresponding to gesture coordinates, calculate each force focus point parameter and transmit it to the haptic feedback module 40, and the haptic feedback module 40 is configured to control the ultrasonic transducer to generate acoustic focus points at gesture coordinates through the transducer drive circuit.

Next, a technical scheme of the display apparatus according to the embodiment of the disclosure will be exemplarily explained through a working principle of the display apparatus.

The ultrasonic transducer 400 of the display substrate 10 emits ultrasonic waves. After a user touches the display substrate 10, a hand of the user bounces off the ultrasonic waves to generate ultrasonic echoes. The ultrasonic echoes cause vibration of thin membrane of the ultrasonic transducer 400 in a receiving mode and to generate voltage signals. The voltage signals are captured by the gesture capture module 30, and gesture coordinates are generated and fed back to the host computer 20. The host computer 20 analyzes object attributes at a touch position, such as cotton is soft, which means that the force acting on the hand is small, and the cup is hard, the force acting on the hand is large, a force difference between adjacent points of rough objects is great, and a force difference between adjacent points of smooth objects is small, etc. The force distribution is analyzed, and phase information of each acoustic focus point of each ultrasonic transducer (or each array element) is calculated and transmitted to the haptic feedback module 40. The haptic feedback module 40 generates a synchronization signal through the transducer drive circuit to independently control each ultrasonic transducer 400, so that ultrasonic waves emitted by the ultrasonic transducers 400 at different positions focus on a acting point at the same time, resulting in haptic sensation. In an exemplary embodiment, a phased array technology is used to achieve acoustic beam focus to generate acoustic focus points, and a time-sharing multiplexing technology is used to achieve multi-touch. Ultrasonic phased array technology is an electrical scan method, in the method, an ultrasonic transmitting direction is changed without mechanical rotation, an ultrasonic transducer (or array element) is controlled through an electronic system to transmit ultrasonic waves according to a certain rule for lag time, thereby controlling the deflection and focus of ultrasonic beams. Acoustic beam focus is a technology to control transmission time delay of each ultrasonic transducer, to obtain ultrasonic superposition interference with different phases, thus changing a focus position. In time-sharing multiplexing technology, when implementing multi-point focus, it is needed to scan each focus point in turn, and correspondingly output a corresponding ultrasound signal.

In the description of the present disclosure, it should be noted that the orientation or positional relationship indicated by the terms "upper", "lower", "one side", "other side", "one end", "other end", "side", "relative", "four corners", "periphery", "rectangular" structure "and the like is based on the orientation or positional relationship shown in the drawings, only for convenience of describing the present disclosure and simplifying the description, and not to indicate or imply that the indicated structure has a specific orientation, is constructed or operates in a specific orientation, and therefore cannot be understood as a limitation of the present disclosure.

In the description of embodiments of the present disclosure, the terms "connection", "direct connection", "indirect connection", "fixed connection", "installation" and "assembly" are to be understood broadly, for example, they may be fixed connection, or they may be detachable connection, or they may be integrally connected, unless explicitly specified and limited otherwise. The terms "installation", "connection" and "fixed connection" may be directly connected, or may be indirectly connected through an intermediate medium, or may be an internal connection between two elements. Those of ordinary skill in the art may understand the meanings of the terms in the present disclosure according to specific situations.

Although the implementation modes of the present disclosure are disclosed above, the contents are only implementation modes adopted to easily understand the present disclosure and not intended to limit the present disclosure. Any person skilled in the art to which the present disclosure pertains may make modifications and variations in implementation forms and details without departing from the essence and scope of the present disclosure, but the scope of patent protection of the present disclosure should still be determined by the scope of the appended claims.

What is claimed is:

1. A display substrate, comprising:
a substrate, an array structure layer disposed on the substrate, a plurality of emitting units and a plurality of ultrasonic transducers disposed at intervals on a side of the array structure layer away from the substrate, wherein
the ultrasonic transducers are disposed between adjacent emitting units, and the array structure layer comprises a transducer drive circuit connected to the ultrasonic transducers, and the transducer drive circuit is configured to control the ultrasonic transducers to transmit ultrasonic waves and receive voltage signals generated by the ultrasonic transducers receiving ultrasonic echoes;
wherein the plurality of emitting units comprise a plurality of rows of emitting units extending along a first direction and disposed at intervals along a second direction and a plurality of columns of emitting units extending along the second direction and disposed at intervals along the first direction;
the ultrasonic transducers are disposed in a region surrounded by adjacent emitting unit rows and adjacent emitting unit columns; or,
the ultrasonic transducers are disposed between adjacent emitting units in at least one row of the plurality of rows of the emitting units; or
the ultrasonic transducers are disposed between adjacent emitting units in at least one column of the plurality of columns of the emitting units;
wherein the plurality of ultrasonic transducers are divided into a plurality of array elements, and the transducer drive circuit comprises a plurality of transducer sub-drive circuits, and the array elements are correspondingly connected to the transducer sub-drive circuits.

2. The display substrate of claim 1, wherein the plurality of array elements comprise a first array element, the ultrasonic transducers of the first array element comprise a plurality of first ultrasonic transducers for transmitting ultrasonic waves and a plurality of second ultrasonic transducers for receiving ultrasonic echoes, and the transducer sub-drive circuit corresponding to the first array element comprises an ultrasonic transmitting circuit connected to a plurality of first ultrasonic transducers and an ultrasonic receiving circuit connected to a plurality of second ultrasonic transducers.

3. The display substrate of claim 2, wherein the first ultrasonic transducers and the second ultrasonic transducers are alternately disposed in the first direction or the second direction.

4. The display substrate of claim 2, wherein an ultrasonic transducer comprises a first electrode and a second electrode, and the ultrasonic transmitting circuit comprises a first power terminal and a second power terminal, wherein the first power terminal is connected to first electrodes of the plurality of first ultrasonic transducers, and the second power terminal is connected to second electrodes of the plurality of first ultrasonic transducers.

5. The display substrate of claim 2, wherein an ultrasonic transducer comprises a first electrode and a second electrode, and a plurality of the second ultrasonic transducers are connected in series, wherein a second electrode of a second ultrasonic transducer at a head end is connected to a first electrode of an adjacent second ultrasonic transducer; and a first electrode of a second ultrasonic transducer at a tail end is connected to a second electrode of an adjacent second ultrasonic transducer; the ultrasonic receiving circuit comprises a first receiving terminal and a second receiving terminal, wherein the first receiving terminal is connected to a first electrode of the second ultrasonic transducer at the head end and the second receiving terminal is connected to a second electrode of the second ultrasonic transducer at the tail end.

6. The display substrate of claim 1, wherein the plurality of array elements comprise a second array element; the transducer drive circuit comprises a transmission-reception integrated circuit correspondingly connected to the second array element; an ultrasonic transducer comprises a first electrode and a second electrode; the transmission-reception integrated circuit comprises a first power terminal, a second power terminal, a first receiving terminal, a second receiving terminal, a first scan terminal, a second scan terminal, a plurality of first switch transistors, a plurality of second switch transistors and a plurality of third switch transistors, wherein the first switch transistors and the second switch transistors correspond to the ultrasonic transducer; a first electrode of a first switch transistor is connected to a first electrode of a corresponding ultrasonic transducer; a second electrode of the first switch transistor is connected to the first power terminal; a control electrode of the first switch transistor is connected to the first scan terminal; a first electrode of a second switch transistor is connected to a second electrode of a corresponding ultrasonic transducer; a second electrode of the second switch transistor is connected to the second power terminal; a control electrode of the second switch transistor is connected to the first scan terminal; the plurality of third switch transistors are alternately connected in series with the plurality of ultrasonic transducers; a first electrode of a third switch transistor is connected to a second electrode of a corresponding ultrasonic transducer; a second electrode of the third switch transistor is connected to a first electrode of a corresponding ultrasonic transducer; a control electrode of the third switch transistor is connected to the second scan terminal; a first electrode of the ultrasonic transducer at a head end is connected to the first receiving terminal; and a second electrode of the ultrasonic transducer at a tail end is connected to the second receiving terminal.

7. The display substrate of claim 1, wherein an emitting unit comprises a Mini LED or μLED, and an ultrasonic transducer comprises a capacitive micromachined ultrasonic transducer.

8. The display substrate of claim 1, further comprising: a light shielding layer disposed on a side of the array structure layer away from the substrate;
the light shielding layer is provided with a first opening and a second opening, the emitting unit is disposed in the first opening, and the ultrasonic transducer is disposed in the second opening; or,
the light shielding layer covers a region of a side of the array structure layer away from the substrate except the emitting units and the ultrasonic transducers.

9. A display apparatus, comprising:
a display substrate, which comprises a substrate, an array structure layer disposed on the substrate, a plurality of emitting units and a plurality of ultrasonic transducers disposed at intervals on a side of the array structure layer away from the substrate, wherein the ultrasonic transducers are disposed between adjacent emitting units, and the array structure layer comprises a transducer drive circuit connected to the ultrasonic transducers, and the transducer drive circuit is configured to control the ultrasonic transducers to transmit ultrasonic waves and receive voltage signals generated by the ultrasonic transducer receiving ultrasonic echoes;
further comprising:
a host, a gesture capture module, a haptic feedback module and a display drive module connected to the host, wherein the display substrate comprises a transducer drive circuit connected to an ultrasonic sensor and a pixel drive circuit connected to an emitting element, and a first power terminal and a second power terminal of the transducer drive circuit are connected to the haptic feedback module; a first receiving terminal and a second receiving terminal of the transducer drive circuit are connected to the gesture capture module; the pixel drive circuit is connected to the display drive module; the display drive module is configured to control the emitting elements of the display substrate to display pictures through the pixel drive circuit, and the gesture capture module is used to capture voltage signals generated by the ultrasonic transducers of the display substrate receiving ultrasonic echoes, generate gesture coordinates and feed back to the host the host is configured to analyze image object attributes corresponding to gesture coordinates, calculate each force focus point parameter and transmit the parameter to the haptic feedback module, and the haptic feedback module is configured to control the ultrasonic transducers to generate acoustic focus points at positions of the gesture coordinates through the transducer drive circuit.

10. The display apparatus of claim 9, wherein the plurality of emitting units comprise a plurality of rows of emitting units extending along a first direction and disposed at intervals along a second direction and a plurality of columns of emitting units extending along the second direction and disposed at intervals along the first direction;
the ultrasonic transducers are disposed in a region surrounded by adjacent emitting units rows and adjacent emitting unit columns; or,
the ultrasonic transducers are disposed between adjacent emitting units in at least one row of the plurality of rows of the emitting units; or
the ultrasonic transducers are disposed between adjacent emitting units in at least one column of the plurality of columns of the emitting units.

11. The display apparatus claim 9, wherein a emitting unit comprises a Mini LED or μLED, and a ultrasonic transducer comprises a capacitive micromachined ultrasonic transducer.

12. The display apparatus of claim 9, wherein the display substrate further comprises: a light shielding layer disposed on a side of the array structure layer away from the substrate;
the light shielding layer is provided with a first opening and a second opening, the emitting units are disposed in the first opening, and the ultrasonic transducers are disposed in the second opening; or,
the light shielding layer covers a region of a side of the array structure layer away from the substrate except the emitting units and the ultrasonic transducers.

13. A preparation method of a display substrate, comprising:
forming an array structure layer on a base substrate, wherein the array structure layer comprises a transducer drive circuit;
forming a plurality of emitting units and a plurality of ultrasonic transducers disposed at intervals on the array structure layer, wherein the ultrasonic transducers are disposed between adjacent emitting units and connected to the transducer drive circuit,
wherein the transducer drive circuit is configured to control the ultrasonic transducers to transmit ultrasonic waves and receive voltage signals generated by the ultrasonic transducer receiving ultrasonic echoes.

14. The preparation method of claim 13, wherein forming the plurality of emitting units and the plurality of ultrasonic transducers disposed at intervals on the array structure layer comprises:
forming an ultrasonic transducer on a substrate;
forming an undercut structure located at a bottom of the ultrasonic transducer on the substrate.

15. The preparation method of claim 14, wherein forming the undercut structure at the bottom of the ultrasonic transducer on the substrate comprises:
through a patterning treatment, forming a plurality of grooves surrounding the ultrasonic transducer and being disposed at intervals on the substrate, etching an inside of a groove, and etching off the substrate at the bottom of the ultrasonic transducer using anisotropy of etching medium to form the undercut structure.

* * * * *